(12) United States Patent
Schmitt et al.

(10) Patent No.: US 11,994,243 B2
(45) Date of Patent: May 28, 2024

(54) COOLANT CONNECTING PIECE, HOUSING SYSTEM AND PRODUCTION THEREOF

(71) Applicant: Robert Bosch GmbH, Stuttgart (DE)

(72) Inventors: Markus Schmitt, Tamm (DE); Benjamin Kopp, Remseck am Neckar (DE); Ralph Glemser, Brackenheim (DE)

(73) Assignee: Robert Bosch GmbH, Stuttgart (DE)

( * ) Notice: Subject to any disclaimer, the term of this patent is extended or adjusted under 35 U.S.C. 154(b) by 56 days.

(21) Appl. No.: 17/946,591

(22) Filed: Sep. 16, 2022

(65) Prior Publication Data

US 2023/0097233 A1 Mar. 30, 2023

(30) Foreign Application Priority Data

Sep. 24, 2021 (DE) .......................... 102021210668.4

(51) Int. Cl.
| | |
|---|---|
| *F16L 21/02* | (2006.01) |
| *F16L 21/035* | (2006.01) |
| *H01M 10/613* | (2014.01) |
| *H01M 10/6567* | (2014.01) |
| *H05K 7/20* | (2006.01) |

(52) U.S. Cl.
CPC ........... *F16L 21/022* (2013.01); *F16L 21/035* (2013.01); *H01M 10/613* (2015.04); *H01M 10/6567* (2015.04); *H05K 7/20272* (2013.01); *H01M 2220/20* (2013.01)

(58) Field of Classification Search
CPC ....... F16L 21/022; F16L 21/035; F16L 41/08; H05K 7/20272

USPC ......................................................... 285/347
See application file for complete search history.

(56) References Cited

U.S. PATENT DOCUMENTS

| | | | | |
|---|---|---|---|---|
| 4,218,080 A * | 8/1980 | Kendrick | ................. | F16L 23/04 |
| | | | | 285/379 |
| 4,708,371 A * | 11/1987 | Elsworth | ................. | F16L 37/56 |
| | | | | 285/120.1 |
| 6,126,206 A * | 10/2000 | Topf, Jr. | ................. | F16L 21/005 |
| | | | | 285/109 |
| 7,083,203 B2 * | 8/2006 | Glaser | ................. | F02M 69/465 |
| | | | | 285/347 |
| 7,971,910 B2 * | 7/2011 | Holt | ...................... | F16L 41/086 |
| | | | | 285/13 |
| 10,760,716 B1 | 9/2020 | Currey et al. | | |

(Continued)

FOREIGN PATENT DOCUMENTS

| | | | | |
|---|---|---|---|---|
| DE | 102017119201 A1 | | 2/2019 | |
| GB | 2107809 A * | | 5/1983 | ........... F02M 55/004 |
| WO | 2006103432 A1 | | 10/2006 | |

*Primary Examiner* — David Bochna
(74) *Attorney, Agent, or Firm* — Michael Best & Friedrich LLP

(57) ABSTRACT

A coolant connecting piece (100) for conducting coolant between a first housing (201, 503) and a second housing (203, 507). The coolant connecting piece (100) comprises a cylindrical main body (101) with a coolant channel formed on an inner side of the main body (101), and a protective ring (103) with a drip edge (117), wherein a cross-section of the protective ring (103) is greater than a cross-section of the main body (101), and wherein the drip edge (117) is configured to let condensate running off on an outer side of the main body (101), opposite the inner side, drip off into a predetermined region (213).

13 Claims, 3 Drawing Sheets

(56) References Cited

U.S. PATENT DOCUMENTS

| | | | | |
|---|---|---|---|---|
| 2002/0180213 A1* | 12/2002 | Juuti | ...................... | F16L 21/035 |
| | | | | 285/373 |
| 2006/0214423 A1* | 9/2006 | Sandman | .............. | F16L 21/022 |
| | | | | 285/370 |
| 2010/0066077 A1* | 3/2010 | Sharma | ................. | F16L 21/022 |
| | | | | 285/124.5 |
| 2010/0140925 A1* | 6/2010 | Raper | ................... | F16L 21/035 |
| | | | | 285/370 |
| 2023/0036437 A1* | 2/2023 | Swernofsky | .......... | F16L 21/035 |

* cited by examiner

COOLANT CONNECTING PIECE, HOUSING SYSTEM AND PRODUCTION THEREOF

BACKGROUND

The presented invention relates to a coolant connecting piece, a housing system and a production method for producing the housing system.

In order to provide high-performance battery systems, individual battery cells are connected together to form battery modules, and battery modules are connected together to form batteries or battery systems.

Due to the large number of different vehicle installation spaces, variable module sizes are required in order to optimally utilize existing installation space.

Li-ion or Li-polymer battery cells heat up as a result of chemical conversion processes, primarily in the case of rapid energy release or absorption. In this case, the more powerful a battery system is, the more it heats up. Accordingly, in the case of particularly powerful battery systems, an active thermal management system is generally required in order to cool and heat the battery cells thereof, the battery cells predominantly having to be cooled.

Thermal management is predominantly carried out by liquid temperature control with a water/glycol mixture. The latter is conducted through channels in cooling plates arranged below respective battery modules. The supply of the cooling plates is realized with a cooling water hose system with corresponding further components in the cooling circuit.

Furthermore, battery systems are often installed in the exterior space of vehicles. Accordingly, such battery systems must be able to withstand corrosive stress over the service life. In particular, sealing points between various housing components are subject to corrosion creep.

SUMMARY

Within the scope of the presented invention, a coolant connecting piece, a housing system and a production method for producing a housing system are presented. In this respect, features and details described in the context of the coolant connecting piece according to the invention naturally also apply in the context of the housing system according to the invention and of the production method according to the invention, and respectively vice versa, so that mutual reference always is or can be made with respect to the disclosure of the individual aspects of the invention.

The presented invention serves in particular to provide a reliable housing system for operating a traction battery in a vehicle. Furthermore, the presented invention serves to compensate for an axial offset between two bores that are not aligned due to component tolerances.

According to a first aspect of the invention presented, a coolant connecting piece for conducting coolant between a first housing, in particular an electronics housing, and a second housing, in particular a battery housing, is thus presented.

The coolant connecting piece comprises a cylindrical main body with a coolant channel formed on an inner side of the main body, and a protective ring with a drip edge, wherein a cross-section of the protective ring is greater than a cross-section of the main body, and wherein the drip edge is configured to let condensate running off on an outer side of the main body opposite the inner side drip off into a predetermined region.

The coolant connecting piece presented is based on the principle that a drip edge is provided on the interface of coolant bores of a battery housing and of an electronics housing by the protective ring of the coolant connecting piece and prevents the condensate running down from entering the coolant bores. The condensate drips into drainage channels provided on a respective housing and drains, for example via oblique surfaces in regions that are non-critical with respect to corrosion.

Accordingly, the protective ring provided according to the invention serves for the controlled discharge of condensate running along the coolant connecting piece. For this purpose, the coolant connecting piece comprises a drip edge, which can be designed, for example, as a sharp or pointed end of the protective ring.

In particular, the drip edge extends radially around the protective ring or along the protective ring and is configured to end at a predetermined position relative to a respective housing so that condensate dripping off at the drip edge impinges on the housing at a predetermined position and can be discharged and/or evaporated there in a non-corrosive manner. The coolant connecting piece is geometrically designed such that it can be brought into a defined position in the Z-direction during the installation into the battery housing. For this purpose, the coolant connecting piece can have, for example, a predetermined length and/or a stop, in which a counter stop on a housing engages when the coolant connecting piece is in the defined position.

It may be provided that the protective ring is arranged centrally on the main body, and the protective ring is formed as a separate element or in one piece with the main body.

As a result of a central positioning of the protective ring, a unilaterally increased load on the coolant connecting piece by, for example, shear forces is minimized.

The protective ring and the main body can be designed in one piece. In particular, the coolant connecting piece can be produced by an injection molding process in which the main body and the protective ring are produced together or simultaneously.

A one-piece coolant connecting piece can be manufactured particularly precisely so that the drip edge can be brought particularly precisely into a predetermined position relative to a corresponding housing.

It may furthermore be provided that the coolant connecting piece comprises a first sealing ring above the protective ring and a second sealing ring below the protective ring.

By means of sealing rings which comprise an elastomer, such as rubber, a defined axial offset between a first bore in a first housing and a second bore in a second housing can be compensated. For this purpose, the first sealing ring can engage in the first bore and the second sealing ring can engage in the second bore so that the axial offset between the first bore and the second bore is compensated by a deformation of the first sealing ring and/or of the second sealing ring, and the main body, as a perpendicularly aligned element, connects the first bore to the second bore.

In particular, the coolant connecting piece or its main body is geometrically designed such that it minimizes an active surface for corrosion creep on the sealing rings. For this purpose, the main body can comprise a number of recesses which minimize the active surface or a contact surface between the main body and the sealing ring.

Accordingly, a cross-section of the main body can be smaller directly below and/or above a respective sealing ring than a cross-section of the main body in a normal region, which defines a predetermined distance from a receptacle in which the coolant connecting piece engages.

It may furthermore be provided that the protective ring comprises a first region and a second region, wherein the first region is thickened in the flow direction of the coolant channel in relation to the second region, and wherein the second region comprises the drip edge.

By means of a region thickened in the flow direction, a minimal gap is provided at a transition of respective bores of various housings to be connected by the coolant connecting piece, said gap protecting corresponding sealing elements from pressurized water by, for example, a high-pressure cleaner. Furthermore, a gap between the housings or housing parts allows residual condensate entering a respective bore to dry off, whereby a load on corresponding sealing rings is minimized as much as possible.

The thickened region can, for example, be conical or oblique so that condensate flowing into the thickened region is guided to the drip edge spaced apart from the respective housings by the thickened region.

It may furthermore be provided that the main body is rounded at its two ends.

A linear contact between the coolant connecting piece and a respective housing is achieved by rounded ends or ends that are designed as radii. This has the advantage that the coolant connecting piece is centered only via its thickest point, in particular its sealing rings, so that a forced position and an associated asymmetrical pressing of the coolant connecting piece is avoided.

A further advantage of rounded ends and associated linear contact with a respective housing is that, in the case of an offset of the housings or the bores thereof, the respective housings can slide on the coolant connecting piece during the installation on one another, when the coolant connecting piece is tilted. Since the coolant connecting piece with rounded ends and a respective housing, in particular with rounded ends in a receptacle for receiving the coolant connecting piece, have only line contact, the friction during tilting is minimized and a movement of the housing relative to the coolant connecting piece is not hindered.

It may furthermore be provided that the main body has an oblique surface above the protective ring in order to guide condensate running along the main body onto the protective ring.

In order that the condensate can completely drain from the main body onto the protective ring, an oblique surface above the protective ring has proven to be advantageous since it minimizes residues of condensate that adhere to the main body.

It may furthermore be provided that the protective ring has a radially circumferential groove which is sloped toward the drip edge at least in regions.

By means of a groove on the protective ring, a space can be created which causes incoming condensate to accumulate until it drips from the drip edge due to its own weight.

An accumulation, in the groove, of an amount of condensate that can drip off is prevented by a slope that extends to the drip edge.

It may furthermore be provided that the groove is V-shaped.

By means of a V-shaped groove, drainage of condensate into the groove is achieved in order to achieve an accumulation of an amount of condensate that can drip off. As soon as the amount of condensate that can drip off is reached, it is guided to the drip edge due to the V-shape and drips off there.

It may furthermore be provided that the main body comprises a number of radial projections spaced apart from one another, wherein at least one projection of the number of projections has an oblique outer edge.

By means of radial projections, a cross-section required for a stable engagement in a bore or a receptacle is provided, but a contact surface between respective elements of the coolant connecting piece, such as between the main body and a sealing ring, is minimized.

By means of an oblique outer edge of a projection of the main body of the coolant connecting piece presented, a gas exchange or ventilation of a region located between the projection and a housing wall is made possible so that capillary forces which would retain condensate penetrated into the region are minimized.

In a second aspect, the presented invention relates to a housing system. The housing system comprises a first housing, a second housing and a possible embodiment of the coolant connecting piece presented, wherein the coolant connecting piece connects a first receptacle of a first coolant channel of the first housing and a second receptacle of a second coolant channel of the second housing in a fluid-conducting manner, and wherein the first housing and/or the second housing comprises a drainage channel which is configured to receive condensate dripping from the drip edge of the coolant connecting piece and to discharge it along a predetermined trajectory.

The drainage channel provided according to the invention can be realized, for example, by oblique surfaces which are formed next to a respective receptacle for receiving the coolant connecting piece.

It may furthermore be provided that a cross-section of the first receptacle and of the second receptacle is larger than a cross-section of the main body but smaller than a cross-section of the protective ring.

By means of a receptacle whose cross-section is smaller than a cross-section of the protective ring or by means of a protective ring whose cross-section is greater than that of a respective receptacle, it is ensured that condensate dripping from the drip edge does not drip into the receptacle but into a predetermined region next to the receptacle.

It may furthermore be provided that a first gap is present between the protective ring and the first receptacle, and a second gap is present between the protective ring and the second receptacle.

By means of gaps between the protective ring and the respective housings, it is achieved that condensate which has entered the gap can dry off. In addition, it is ensured that respective receptacles of the housings are sufficiently ventilated. Accordingly, the gaps ensure that the receptacles are not permanently loaded with condensate.

It may furthermore be provided that the first receptacle is longer than the second receptacle.

A longer first receptacle ensures a distance between the coolant connecting piece and a respective housing so that the coolant connecting piece can move in the flow direction in the first receptacle in order to compensate for tolerances.

It may furthermore be provided that the housing system comprises a joining aid, wherein the joining aid comprises an alignment pin and a first bore in the first housing as well as a second bore in the second housing.

By means of an alignment pin and respective bores on respective housings, the housings can be aligned and fixed relative to one another in particular during a production process, so that an axial offset between the respective receptacles of the housings is minimized.

In a third aspect, the presented invention relates to a production method for producing a possible embodiment of the presented housing system, in which a possible embodiment of the coolant connecting piece presented is introduced into a first housing and a second housing in order to provide a fluid-conducting connection between the first housing and the second housing.

BRIEF DESCRIPTION OF THE DRAWINGS

Further advantages, features and details of the invention become apparent from the following description, in which exemplary embodiments of the invention are described in detail with reference to the drawings. In this respect, the features mentioned in the claims and in the description can be essential to the invention individually or in any combination.

Shown are.

DETAILED DESCRIPTION

Figure 1:
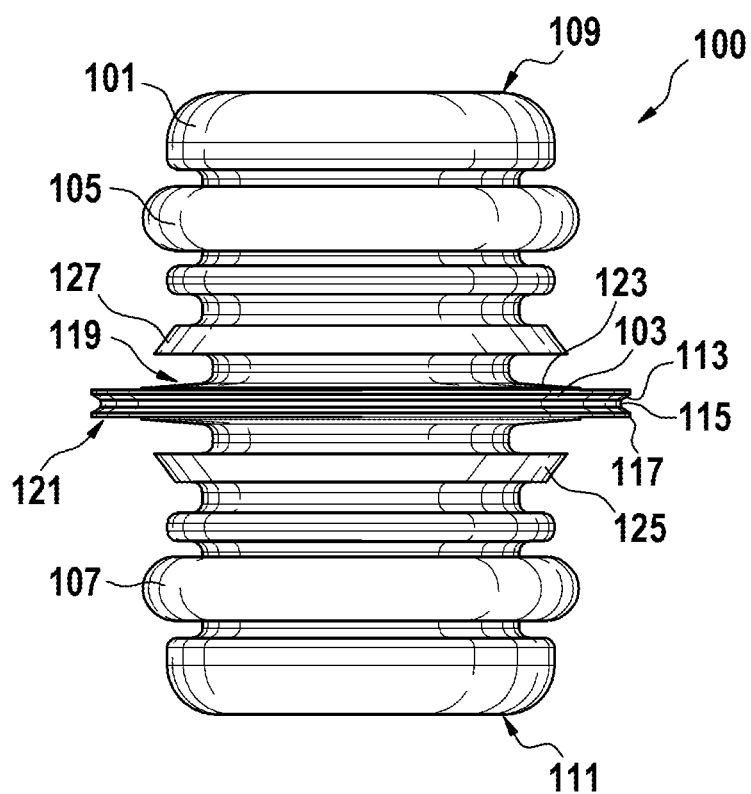
FIG. 1 a schematic representation of a possible embodiment of the coolant connecting piece according to the invention, FIG. 2 a schematic representation of the housing system according to the invention, FIG. 3 a perspective view of the housing system according to FIG. 2, FIG. 4 a further perspective view of the housing system according to FIG. 2, FIG. 5 a possible embodiment of the housing system according to the invention with a joining aid, FIG. 6 a possible embodiment of the production method according to the invention.

FIG. 1 shows a coolant connecting piece 100. The coolant connecting piece 100 comprises a main body 101, a protective ring 103 as well as an optional first sealing ring 105 and an optional second sealing ring 107.

In the interior of the main body 101, a channel is formed through which coolant can flow between a first end 109 to a second end 111.

In the present case, the coolant connecting piece is mirror-symmetrical in order to prevent incorrect installation.

The first end 109 and the second end 111 are each radially rounded so that when the coolant connecting piece is introduced into a receptacle of a respective housing, only a linear contact occurs between the housing and the coolant connecting piece. This has the advantage that the connecting piece is centered only via the corresponding sealing ring 105 or 107. Accordingly, a forced position of the main body 101 and a resultant asymmetrical pressing or squeezing of the sealing ring 105 or 107 are avoided.

A further advantage of the linear contact is that, in the case of an offset of receptacles in respective housings to be connected, the respective housings can slide on the main body when the coolant connecting piece 100 is tilted in a respective receptacle. In particular, the line contact minimizes a frictional force between the coolant connecting piece 100 and the housing when the coolant connecting piece 100 is tilted and enables its movement in a respective receptacle.

In the present case, the protective ring 103 has, by way of example, an oblique surface 113 in a groove 115 so that condensate flowing into the groove 115 flows to a drip edge 117 and drips from the drip edge into a predetermined region. In the present case, the groove 115 is V-shaped by way of example.

The protective ring 103 comprises an inner region 119 whose cross-section overlaps with a cross-section of the main body 101. Furthermore, the protective ring 103 comprises an outer region 121, whose cross-section is greater than the cross-section of the main body 101. Accordingly, the outer region 121 extends beyond the main body 101.

The outer region 121 of the protective ring 103 is in particular flat on a lower side of the protective ring 103 in the direction of gravity so that condensate adhering to the drip edge 117 cannot run inward, i.e., in the direction of the main body 101.

The drip edge 117 is pointed in order to achieve a controlled dripping of condensate in the Z-direction or into a predetermined region.

The protective ring 103 is designed to be as thin as possible in order to minimize an amount of condensate potentially adhering to the protective ring 103.

On the inner region 119 of the protective ring 103, the coolant connecting piece 100 in the present case comprises a slope, i.e., an oblique plane 123, as a result of which condensate running off on the main body is guided onto the protective ring 103 and accordingly to the drip edge 117. The oblique plane 123 can be formed by the main body 101 or by the protective ring 103.

Furthermore, it can be clearly seen in FIG. 1 that the coolant connecting piece 100 is sloped or beveled on its outer projections 125 and 127. Since, in the installed state, the outer projections 125 and 127 are positioned on an outer edge of a receptacle of a housing for receiving the coolant connecting piece 100, the bevel of the outer projections 125 and 127 enables a gas exchange in the respective receptacle and minimizes, as a result thereof, a capillary effect in the receptacles which would retain condensate in the receptacles.

As a result of the bevel of the outer projections 125 and 127, a contour of the outer projections 125 and 127 is recessed inward in order to avoid a continuous constant gap which would facilitate penetration of condensate into a receptacle. The contour of the outer projections 125 and 127 brings about a sufficient distance between the coolant connecting piece 100 and the respective receptacles so that the receptacles are sufficiently ventilated and oxygen depletion and a resultant accelerated corrosion creep do not occur in the region of the sealing rings 105 and 107.

The dimensions of the sealing rings 105 and 107 are selected such that their cord thickness is large, i.e., larger, in comparison to the inner diameter. This achieves a long sealing section, as a result of which a time until corrosion creep of the sealing rings 105 and 107 is maximized.

A Shore hardness of the sealing rings 105 and 107 is, for example, more than 60 Shore, preferably 70 Shore, in order to prevent the sealing rings 105 and 107 from being able to be pushed over the projections of the main body 101 and the sealing rings 105 and 107 from becoming damaged during a production process for connecting two housings by means of the coolant connecting piece 100.

Optionally, the sealing rings 105 and 107 can comprise a sliding coating, a sliding lacquer or a lubricant in order to facilitate a production process for connecting two housings by means of the coolant connecting piece 100. This additionally has the advantage that the coolant piece 100 can be aligned more easily in the case of an axial offset between respective receptacles of the housings.

By way of example, the coolant connecting piece 100 is designed as a plastic injection-molded part.

Figure 2:
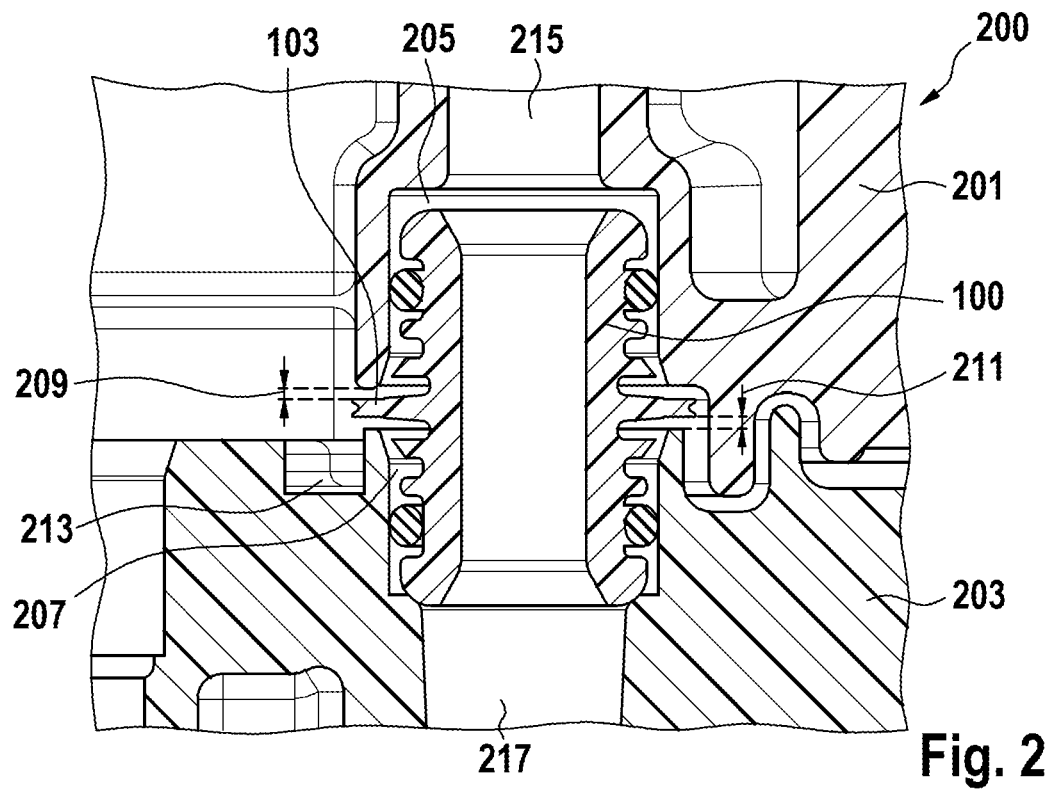

FIG. 2 shows a housing system 200. The housing system 200 comprises a first housing 201, such as an electronics housing, and a second housing 203, such as a battery housing.

The first housing 201 comprises a first bore or a receptacle 205, which is part of a first coolant channel 215 for conducting coolant through the first housing 201.

The second housing 203 comprises a second bore or a second receptacle 207, which is part of a second coolant channel 217 for conducting coolant through the second housing 203.

A coolant connecting piece, in the present case by way of example the coolant connecting piece 100 according to FIG. 1, is introduced both into the first receptacle 205 and into the second receptacle 207, and connects, as a result, the first coolant channel 215 of the first housing 201 to the second coolant channel 217 of the second housing 203 in a fluid-conducting manner.

It can be clearly seen in FIG. 2 that the coolant connecting piece 100 is designed such that the protective ring 103 with its drip edge 117 is reliably spaced at a first distance 209 from the first housing 201 and at a second distance 211 from the second housing 203.

Even when the coolant connecting piece 100 is tilted, a minimum distance is maintained. This has the effect that the receptacles 205 and 207 can dry again when condensate or jet water has penetrated into them and the receptacles 205 and 207 are sufficiently ventilated. Accordingly, the sealing rings 105 and 107 are not permanently loaded with condensate, which leads to minimized corrosion creep of the seal.

The drip edge 117 is positioned such that condensate dripping off at the drip edge 117 drips into a drainage channel 213. The drainage channel 213 is oblique in order to discharge incident condensate on a predetermined path.

It can furthermore be clearly seen in FIG. 2 that the first receptacle 205 is longer than the second receptacle 207 so that a distance between one end of the first receptacle 205 and the coolant connecting piece 100 arises in order to enable a movement of the coolant connecting piece 100 in the receptacles 205 and 207.

During the production of the housing system 200, the coolant connecting piece 100 is first mounted in the second receptacle 207 of the second housing 203. In order to be able to reliably carry this out in an automated manner, the second housing 203 comprises, in the lower region of the second receptacle 207, a radius or a rounding which serves as a stop. This stop can already be produced in the die casting process for producing the second housing 203. Since the coolant connecting piece 100 is rounded at its ends 109, 111, contact between the second housing 203 and the coolant connecting piece 100 takes place only along a line or a very narrow region.

Figure 3:
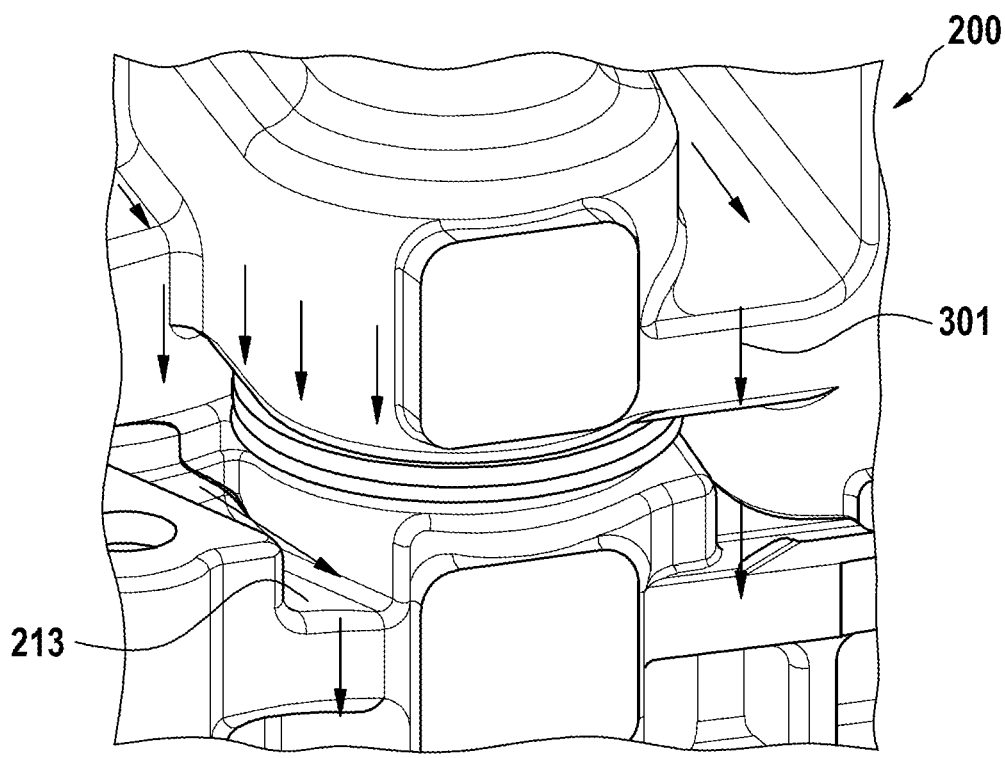

FIG. 3 shows the housing system 200 in an exterior view. It can be clearly seen in FIG. 2 that the drainage channel 213 discharges dripping condensate on a predetermined path, as indicated by arrows 301.

Figure 4:
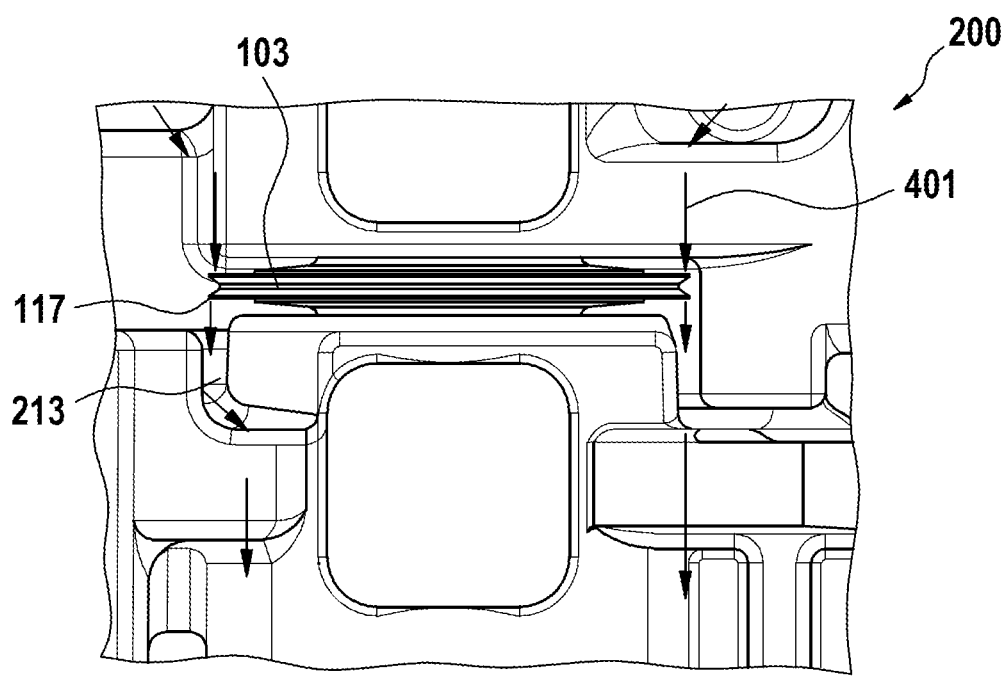

FIG. 4 likewise shows the housing system 200 in an exterior view.

Because the cross-section of the protective ring 103 is greater than the cross-section of the main body 101, condensate drips from the drip edge 117 into the drainage channel 213 and not into the second receptacle 207, as indicated by arrows 401.

Figure 5:
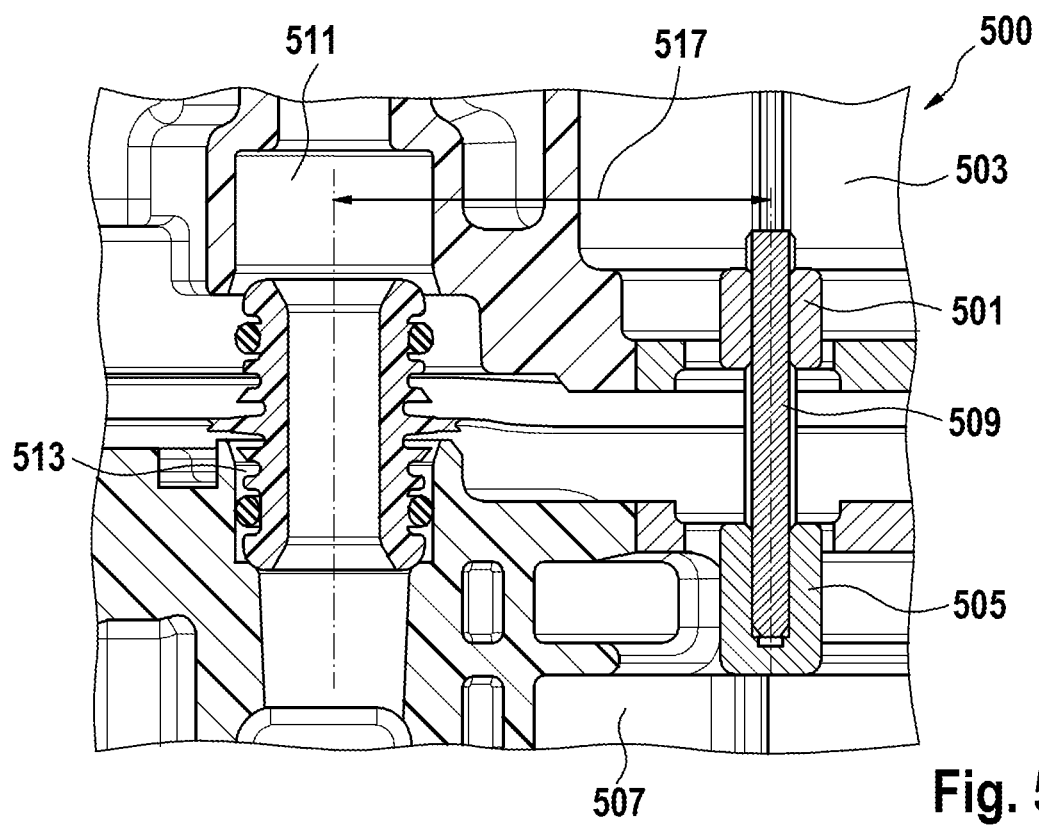

FIG. 5 shows a housing system 500 with a joining aid 501. The joining aid 515 comprises a first bore 501 in a first housing 503 and a second bore 505 in a second housing 507 of the housing system. Furthermore, the joining aid 501 comprises an alignment pin 509.

Preferably, the alignment pin 509 is first introduced into the bore 501, 505 of the housing 503, 507 into which the coolant connecting piece is also introduced first. For example, the alignment pin 509 is pressed in a form-fitting connection so that movement tolerances between the housing 503, 507 and the alignment pin 509 are minimized.

As soon as the alignment pin is arranged in, for example, the second bore 505 of the second housing 507, the first housing 503 is positioned above the second housing 507 in the Z-direction and then guided in the direction of the second housing 507. In this case, the length of the alignment pin 509 is selected such that it enters the first bore 501 in the first housing 503 before the coolant connecting piece 100 engages in a corresponding first receptacle 511 on the first housing 503. As a result, a guided automatable production of the housing system 500 can take place and a misalignment of the first housing 503 relative to the second housing 507 does not occur during production.

The first bore 501 in the first housing 503 preferably has an insertion bevel which is large enough that the coolant connecting piece 100 can reliably find its way into the first receptacle 511 even in the case of non-alignment or slight tilting of the two housings 503, 507.

Preferably, the bores 501, 505 for the alignment pin 509 are located in direct proximity to the receptacles for the coolant connecting piece 100 so that tolerances of the receptacles relative to one another are minimized, as indicated by arrow 517.

The bores 501, 505 for the alignment pin 500 as well as the receptacles and the coolant channels are preferably machined in the same clamping operation, as a result of which tolerances relative to one another can be minimized. The housings 503, 507 are centered by means of the alignment pin 509 and not by the coolant connecting piece 100, which leads to a defined mounting situation.

Figure 6:
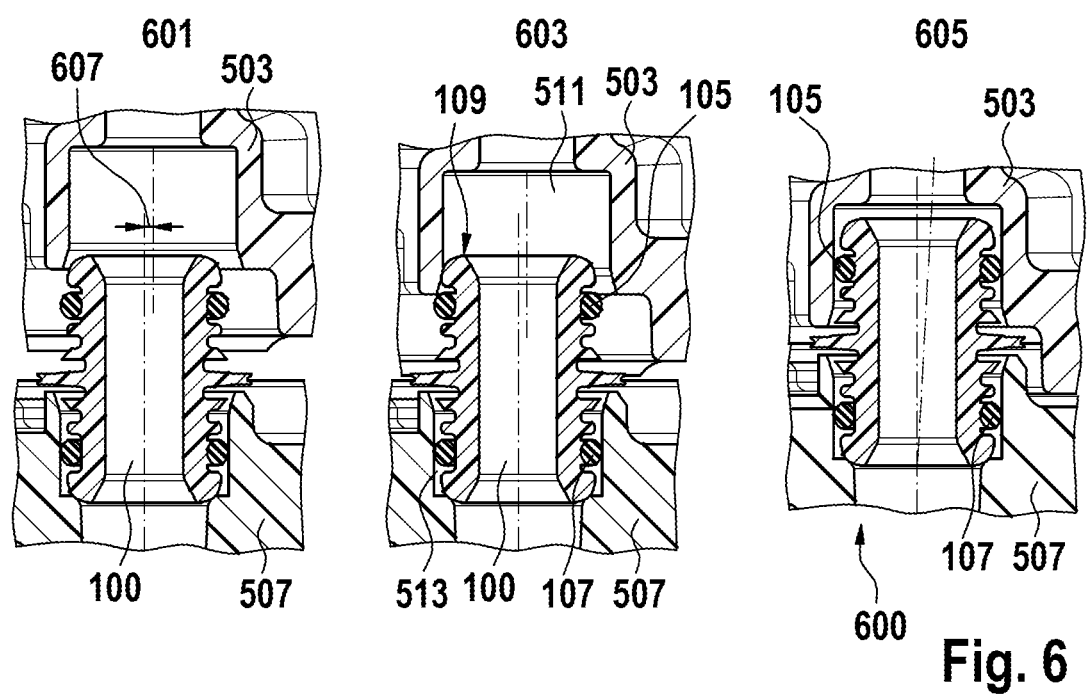

FIG. 6 shows a production method 600 for producing, for example, the housing system 500 according to FIG. 5.

In a first step 601, the first housing 503 is aligned relative to the second housing 507, into which the coolant connecting piece 100 has been introduced, by means of the alignment pin 509 (not shown here), as indicated by arrow 607.

In a second step 603, the first housing 503 is attached to the second housing 507. In the process, the coolant connecting piece 100 is centered in the first receptacle on the first housing 503 via the first rounded end 109 on the coolant connecting piece 100.

It can be seen that the first sealing ring 105 is pressed only when the coolant connecting piece 100 has been centered via the rounded end 109 due to axial offset between the first receptacle 511 of the first housing 503 and a second receptacle 513 of the second housing 507. As a result, the first sealing ring 105 is protected against damage by squeezing during the production process.

In a third step 605, the coolant connecting piece 100 is automatically aligned in the two receptacles 511, 513 of the two housings 503 and 507. In the case of an axial offset between the two receptacles 511 and 513 of the two housings 503 and 507, the coolant connecting piece 100 is tilted since the second sealing ring 107 presses into a centered position during a pressing operation of the housings 503 and 507.

Since the coolant connecting piece 100 has sufficient clearance in the case of a defined tilting in the receptacles 511 and 513 of the housings 503 and 507, the coolant connecting piece is centered via the sealing rings 105 and 107 during the pressing operation.

The invention claimed is:

1. A coolant connecting piece (100) for conducting coolant between a first housing (201, 503) and a second housing (203, 507), wherein the coolant connecting piece (100) comprises:
   a cylindrical main body (101) with a coolant channel formed on an inner side of the main body (101),
   a protective ring (103) with a drip edge (117),
   wherein a cross-section of the protective ring (103) is greater than a cross-section of the main body (101),
   wherein the drip edge (117) is configured to let condensate running off on an outer side of the main body (101), opposite the inner side, drip off into a predetermined region (213),
   wherein the protective ring (103) is arranged centrally on the main body (101), and the protective ring (103) is configured as a separate element or in one piece with the main body (101), and
   wherein the protective ring (103) has a radially circumferential groove (115) which is sloped toward the drip edge (117) at least in regions.

2. The coolant connecting piece (100) according to claim 1, wherein
   the coolant connecting piece (100) comprises a first sealing ring (105) above the protective ring (103) and a second sealing ring (107) below the protective ring (103).

3. The coolant connecting piece (100) according to claim 1, wherein
   the protective ring (103) comprises a first region (121) and a second region (119),
   the first region (121) being thickened in a flow direction of the coolant channel in relation to the second region (119), and
   the second region (119) comprising the drip edge (117).

4. The coolant connecting piece (100) according to claim 1, wherein
   the main body (101) is rounded at its two ends (109, 111).

5. The coolant connecting piece (100) according to claim 1, wherein
   the main body (101) has an oblique surface (123) above the protective ring (103) in order to guide condensate running along the main body (101) onto the protective ring (103).

6. The coolant connecting piece (100) according to claim 1, wherein the groove (115) is V-shaped.

7. The coolant connecting piece (100) according to claim 1, wherein
   the main body (101) comprises a plurality of radial projections spaced apart from one another, at least one projection of the plurality of projections having an oblique outer edge (125).

8. A housing system (200, 500),
   wherein the housing system (200, 500) comprises:
      a first housing (201, 503),
      a second housing (203, 507),
      a coolant connecting piece (100) according to claim 1,
   wherein the coolant connecting piece (100) connects a first receptacle (205, 511) of a first coolant channel (215) of the first housing (201, 503) and a second receptacle (207, 513) of a second coolant channel (217) of the second housing (203, 507) in a fluid-conducting manner,
   wherein the first housing (201, 503) and/or the second housing (203, 507) comprises a drainage channel (213) configured to receive condensate dripping from the drip edge (117) of the coolant connecting piece (100) and to discharge the condensate along a predetermined trajectory.

9. The housing system (200, 500) according to claim 8, wherein
   a cross-section of the first receptacle (205, 511) and of the second receptacle (207, 513) is greater than a cross-section of the main body (101) but smaller than a cross-section of the protective ring (103).

10. The housing system (200, 500) according to claim 8, wherein
    a first gap (209) is present between the protective ring (103) and the first receptacle (205, 511), and a second gap (211) is present between the protective ring (103) and the second receptacle (207, 513).

11. The housing system (200, 500) according to claim 8, wherein
    the first receptacle (205, 511) is longer than the second receptacle (207, 513).

12. The housing system (200, 500) according to claim 8, wherein
    the housing system (200, 500) comprises a joining aid (515),
    the joining aid (515) comprising an alignment pin (509) and a first bore (501) in the first housing (503) as well as a second bore (505) in the second housing (507).

13. A production method (600) for producing a housing system (200, 500) according to claim 8, in which a coolant connecting piece (100) is introduced into a first housing (201, 503) and a second housing (203, 507) in order to provide a fluid-conducting connection between the first housing (201, 503) and the second housing (203, 507).

* * * * *